United States Patent
So et al.

(10) Patent No.: US 10,607,917 B2
(45) Date of Patent: Mar. 31, 2020

(54) SUBSTRATE

(71) Applicant: FUJITSU LIMITED, Kawasaki-shi, Kanagawa (JP)

(72) Inventors: Tsuyoshi So, Kawasaki (JP); Takaya Nakayama, Kawasaki (JP); Takeshi Nishiyama, Kawasaki (JP); Jiro Tsujimura, Kawasaki (JP); Yuki Kanai, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/407,226

(22) Filed: May 9, 2019

(65) Prior Publication Data
US 2019/0363034 A1 Nov. 28, 2019

(30) Foreign Application Priority Data
May 24, 2018 (JP) .................................. 2018-099523

(51) Int. Cl.
*H01L 23/40* (2006.01)
*H05K 1/18* (2006.01)
*H05K 1/02* (2006.01)
*H05K 1/11* (2006.01)

(52) U.S. Cl.
CPC ....... *H01L 23/4006* (2013.01); *H05K 1/0203* (2013.01); *H05K 1/181* (2013.01); *H01L 2023/4062* (2013.01); *H01L 2023/4068* (2013.01); *H01L 2023/4081* (2013.01); *H01L 2023/4087* (2013.01); *H05K 1/117* (2013.01); *H05K 2201/09063* (2013.01); *H05K 2201/10393* (2013.01); *H05K 2201/10409* (2013.01)

(58) Field of Classification Search
CPC combination set(s) only.
See application file for complete search history.

(56) References Cited

U.S. PATENT DOCUMENTS

| 7,518,235 | B2* | 4/2009 | Coico | H01L 23/4006 257/719 |
|---|---|---|---|---|
| 10,372,024 | B2* | 8/2019 | Kase | H05K 13/00 |
| 2004/0084764 | A1* | 5/2004 | Ishimine | H01L 23/4006 257/706 |
| 2005/0167153 | A1* | 8/2005 | Uzuka | H05K 3/303 174/138 E |
| 2005/0248026 | A1* | 11/2005 | So | H01L 23/4006 257/706 |
| 2006/0192293 | A1* | 8/2006 | So | H01L 23/40 257/778 |
| 2006/0227514 | A1* | 10/2006 | Kang | H04N 5/7458 361/719 |
| 2008/0298012 | A1* | 12/2008 | Lan | G06F 1/20 361/688 |
| 2009/0154102 | A1* | 6/2009 | Zhou | H01L 23/4006 361/700 |

(Continued)

FOREIGN PATENT DOCUMENTS

JP 2002-033422 1/2002

*Primary Examiner* — William H. Mayo, III
*Assistant Examiner* — Krystal Robinson
(74) *Attorney, Agent, or Firm* — Fujitsu Patent Center

(57) ABSTRACT

A substrate includes a circuit board, a heat generator mounted over a mounting surface of the circuit board, a heat sink in contact with the heat generator, a retainer attached to the mounting surface so as to retain the heat generator and reinforce the circuit board, and a fastener configured to fix the heat sink to the retainer so as to bring the heat sink into contact with the heat generator.

10 Claims, 14 Drawing Sheets

(56) References Cited

U.S. PATENT DOCUMENTS

| | | | |
|---|---|---|---|
| 2009/0244849 A1* | 10/2009 | Min | H01L 23/4093 361/710 |
| 2010/0226102 A1* | 9/2010 | So | H01L 23/4006 361/748 |
| 2011/0004716 A1* | 1/2011 | Staal | G06F 3/162 710/301 |
| 2012/0186779 A1* | 7/2012 | Tan | H01L 23/4093 165/67 |
| 2012/0211196 A1* | 8/2012 | Liu | H01L 23/4006 165/67 |
| 2014/0154912 A1* | 6/2014 | Hirschy | H01R 13/6595 439/487 |
| 2014/0239488 A1* | 8/2014 | Kobayashi | H01L 23/36 257/718 |
| 2014/0262449 A1* | 9/2014 | Gektin | H01L 23/4006 174/252 |
| 2014/0345842 A1* | 11/2014 | Ma | H01L 23/4006 165/185 |
| 2015/0049450 A1* | 2/2015 | Okamoto | H01L 23/49816 361/779 |
| 2015/0062827 A1* | 3/2015 | Aizawa | H05K 7/2049 361/720 |
| 2015/0327353 A1* | 11/2015 | Dickover | H05K 7/2039 361/679.54 |
| 2016/0124474 A1* | 5/2016 | So | G06F 1/20 361/679.52 |
| 2016/0211191 A1* | 7/2016 | Tan | H01L 23/3672 |
| 2016/0262285 A1* | 9/2016 | Lin | H05K 7/20154 |
| 2016/0327996 A1* | 11/2016 | Sasabe | H05K 7/20 |
| 2016/0360645 A1* | 12/2016 | Achard | H05K 7/20409 |
| 2017/0014929 A1* | 1/2017 | So | B23K 35/025 |
| 2017/0034951 A1* | 2/2017 | Wang | G02B 6/4269 |
| 2017/0069990 A1* | 3/2017 | Sizemore | H05K 3/366 |
| 2017/0359920 A1* | 12/2017 | Huang | G06F 1/186 |

* cited by examiner

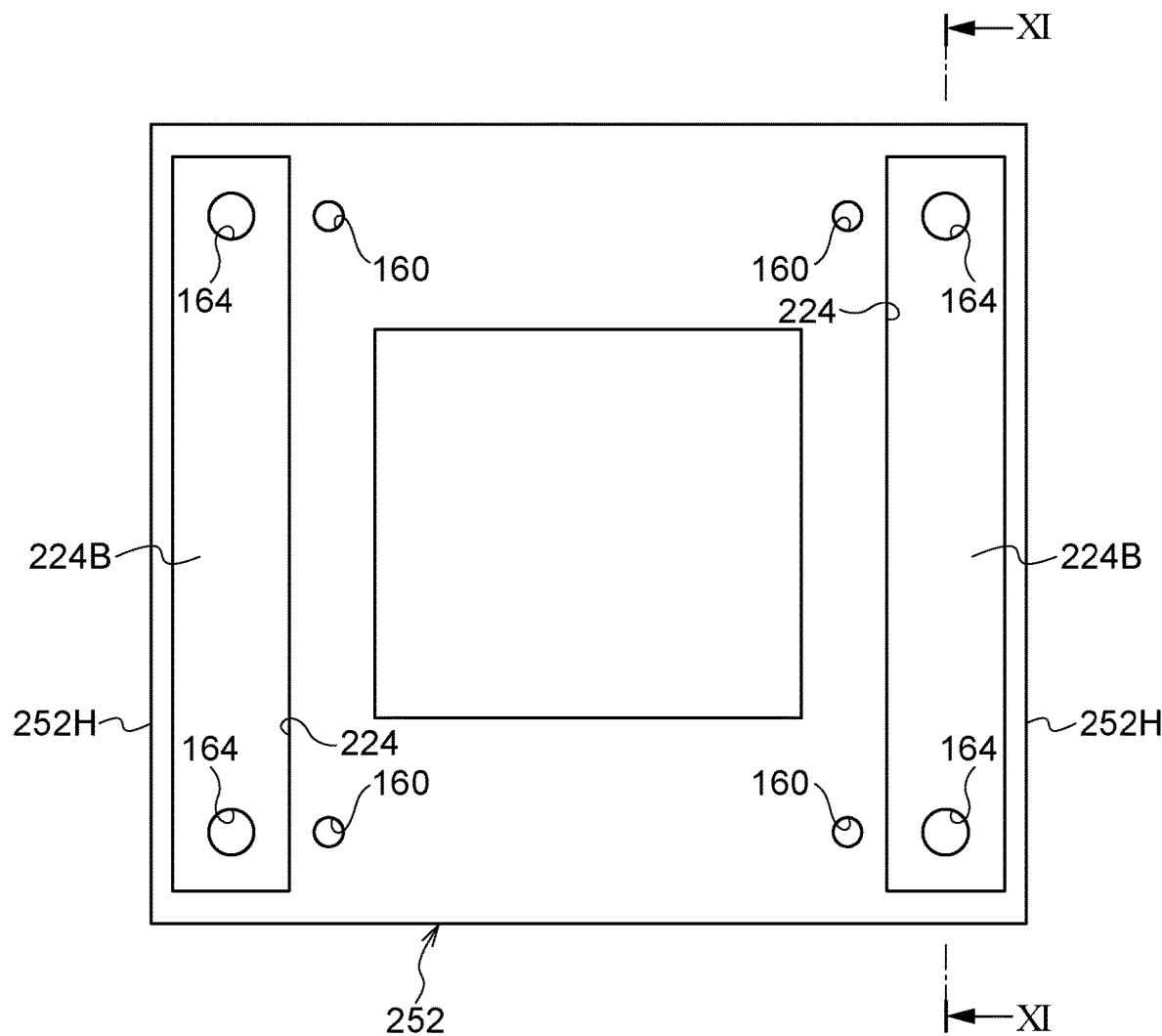
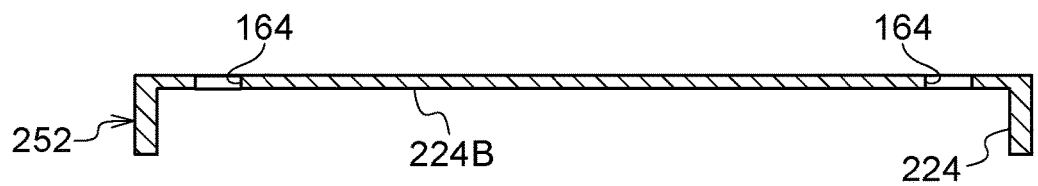

under what is known as the relations of expansion functionality.

SUBSTRATE

CROSS-REFERENCE TO RELATED APPLICATION

This application is based upon and claims the benefit of priority of the prior Japanese Patent Application No. 2018-99523, filed on May 24, 2018, the entire contents of which are incorporated herein by reference.

FIELD

The embodiments discussed herein are related to a substrate.

BACKGROUND

A heat conducting sheet which is composed of a heat-conducting flexible rubber-like elastic body and includes a sheet-like thermal connection section interposed between an IC chip that generates heat and a heat sink is disclosed. In the heat conducting sheet, a reinforcement section protruding around the thermal connection section is provided at least a part of the outer periphery of the thermal connection section.

Related techniques are disclosed in, for example, Japanese Laid-open Patent Publication No. 2002-33422.

SUMMARY

According to an aspect of the embodiments, a substrate includes a circuit board, a heat generator mounted over a mounting surface of the circuit board, a heat sink in contact with the heat generator, a retainer attached to the mounting surface so as to retain the heat generator and reinforce the circuit board, and a fastener configured to fix the heat sink to the retainer so as to bring the heat sink member into contact with the heat generator.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 12 is a bottom view illustrating a reinforcement member of the second embodiment;

FIG. 13 is a cross-sectional view illustrating the reinforcement member of the second embodiment;

DESCRIPTION OF EMBODIMENTS

To promote heat dissipation from a heat generating component (a heat generator) mounted on a base material (a circuit board), the heat generating component is sometimes configured to be in contact with a heat dissipation member (a heat sink). To attach the heat dissipation member to the base material with screws in such a structure, insertion holes to insert the screws are formed in the base material. Forming such insertion holes in the base material reduces the area for wirings in the base material. Furthermore, when heads of the screws are located on the opposite side of the base material from the surface on which the heat generating component is mounted, the heads of the screws sometimes interfere with attachment of the substrate to an electronic device or the like.

Hereinafter, a description is given of embodiments of the technique to reduce the number of holes formed in the base material in the structure where heat from the heat generating component mounted on the base material is dissipated through the heat dissipation member.

First Embodiment

Figure 1:
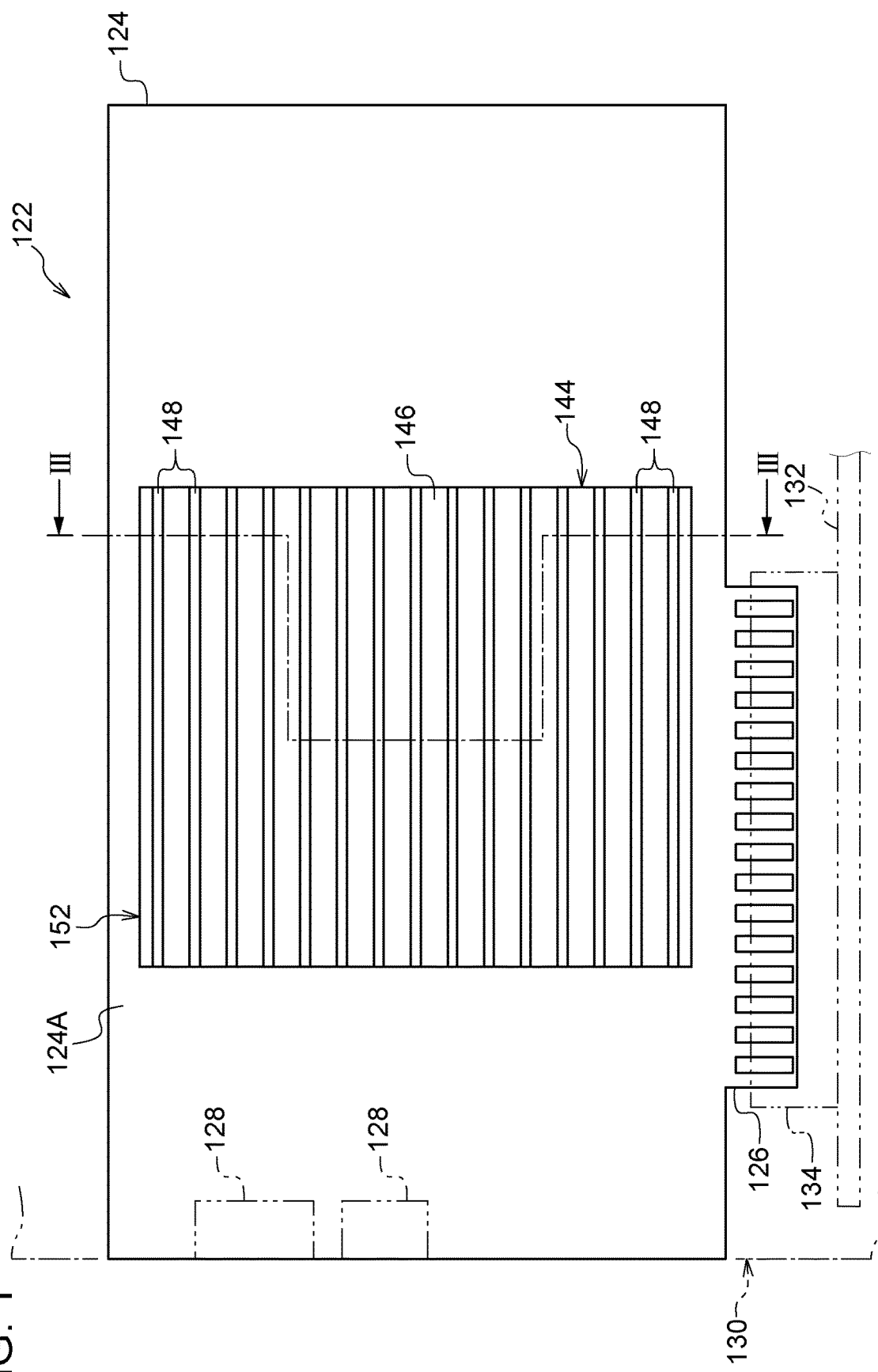
FIG. 1 is a plan view illustrating a substrate of a first embodiment together with a part of an electronic device.
Figure 2:
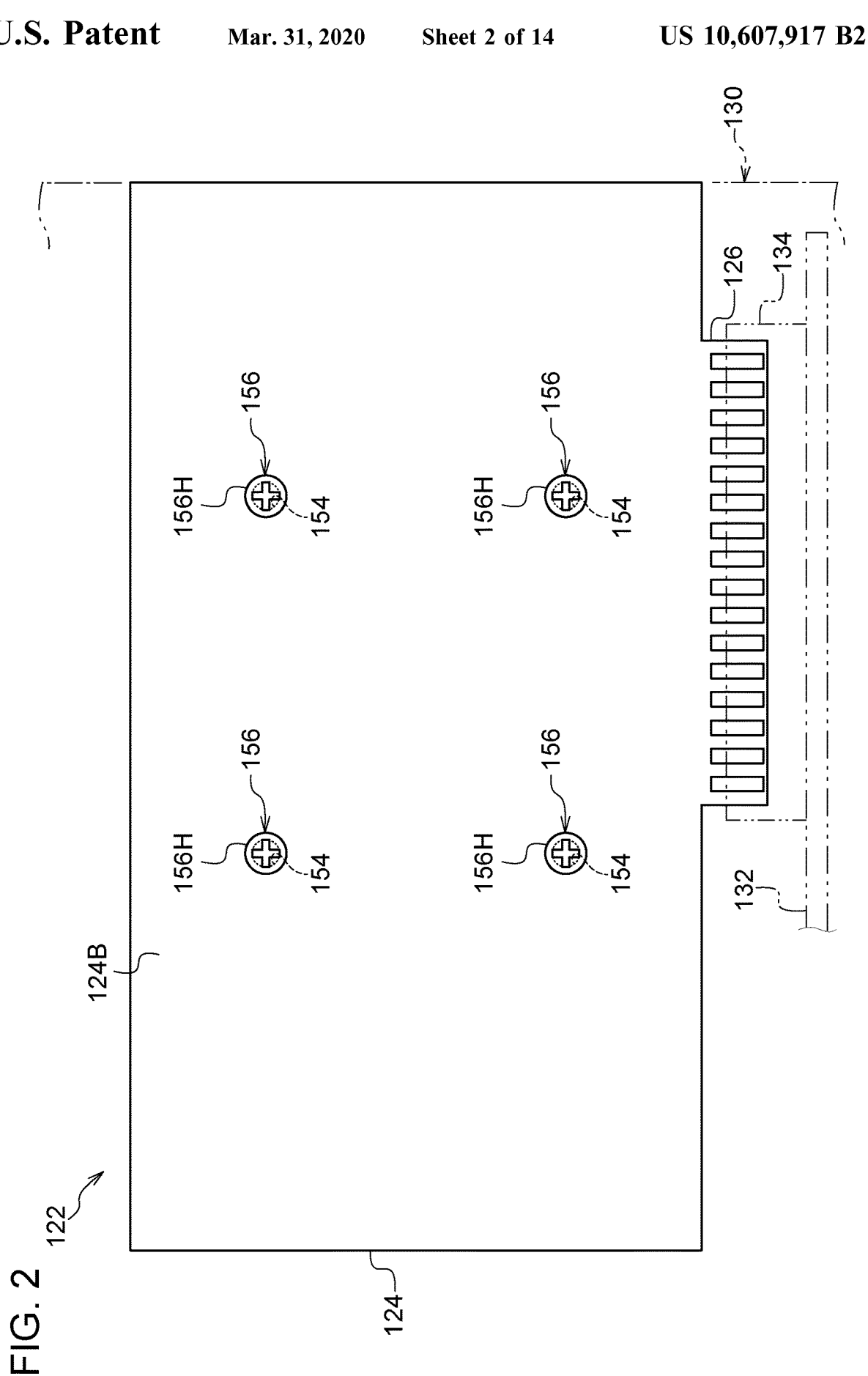
FIG. 2 is a bottom view illustrating the substrate of the first embodiment together with a part of the electronic device.
Figure 3:
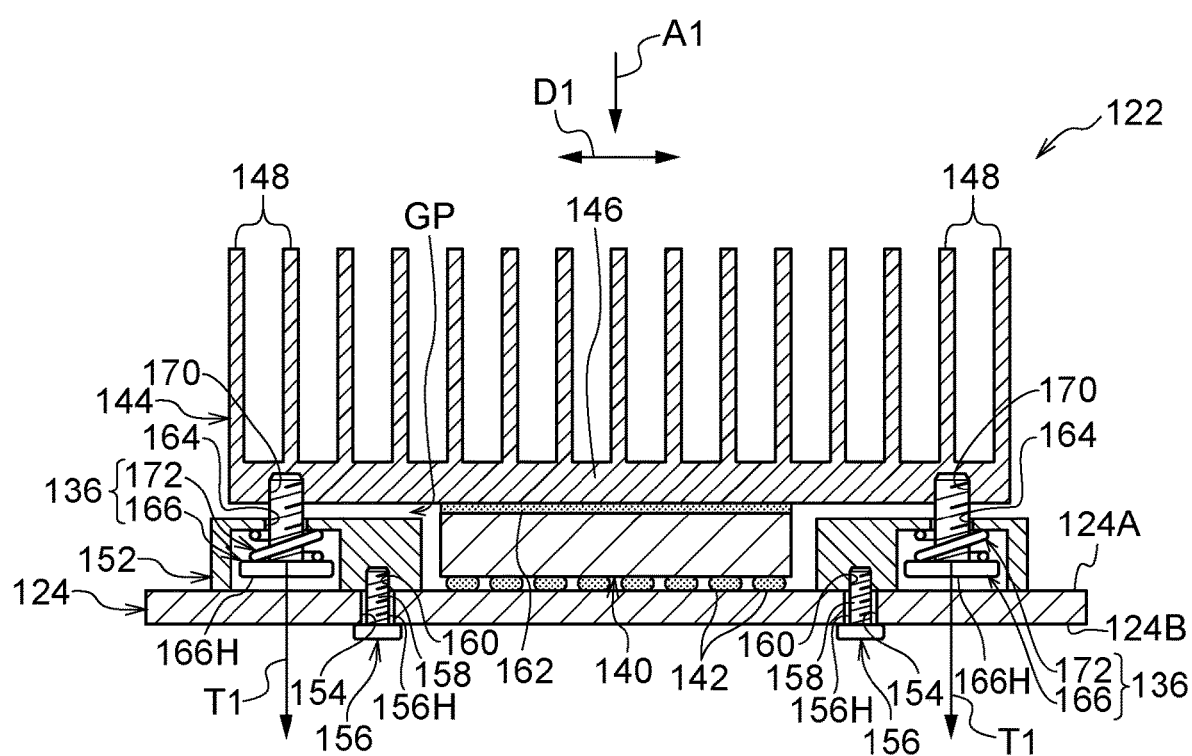
FIG. 3 is an end view of the substrate of the first embodiment cut along a line III-III of FIG. 1.

As illustrated in FIGS. 1 to 3, a substrate 122 includes a plate-shaped base material (an example of circuit board) 124 made of an insulating material. In the example illustrated in FIGS. 1 and 2, the base material 124 is rectangular when viewed in the plate-thickness direction (the direction of arrow A1 illustrated in FIG. 3). In the middle of one of the long sides of the base material 124, a terminal 126 is provided.

The material of the base material 124 is glass epoxy, paper phenol, paper epoxy, or ceramic, for example.

As illustrated in FIGS. 1 and 2, the substrate 122 is inserted into a slot 134, which is provided for a motherboard 132 within an electronic device 130, and the terminal 126 is electrically connected to the motherboard 132. The substrate 122 in the first embodiment is a member which is electrically connected to the motherboard 132 in such a manner to exert a function to extend the functionality of the electronic device 130. The substrate 122 is an extension card or board. Functions added by such an extension card include image processing, voice processing, or a communication processing, for example, and are not particularly limited. A specific example of extension cards is a peripheral component interconnect (PCI) card. It is obvious that the substrate 122 of the first embodiment is not limited to such an extension card.

As illustrated in FIG. 1, the substrate 122 of the first embodiment is provided with connectors 128 on one of the short sides. The substrate 122 may be electrically connected to external devices or cables through the connectors 128.

One surface of the base material 124 is a mounting surface 124A. On the mounting surface 124A, a heat generating component 140 is mounted. The heat generating component 140 is electrically connected through solder balls 142 or the like, to a not-illustrated wiring pattern on the base material 124. The heat generating component 140 is a chip of an integrated circuit used for the aforementioned functionality extension, for example. The heat generating component 140 is of a rectangular shape (including a square) when viewed in the normal direction to the base material 124 (in the direction of arrow A1).

A heat dissipation member 144 is provided on the opposite side of the heat generating component 140 from the base material 124. The heat dissipation member 144 is a heat sink in the first embodiment. The heat dissipation member 144 includes a base 146 and plural fins 148. The heat sink is made of a high heat conducting material, such as metal (aluminum or copper, for example).

The base 146 of the heat generating component 140 is a member which is of a larger rectangular plate-shape than the heat generating component 140 when viewed in the normal direction (the direction of arrow A1) of the base material 124. Central part of the base 146 is in contact with the heat generating component 140 through a thermal bonding member 162. The other part of the base 146 than the central part protrudes outside of the heat generating component 140 when viewed in the normal direction of the base material 124.

The plural fins 148 are continuous to the base 146 and are individually stood at regular intervals in the thickness direction thereof (in the direction of arrow D1). Heat from the heat generating component 140 is transferred through the base 146 to the fins 148 to dissipate into the air. The heat dissipation member 144 has a wide surface area (heat dissipation area) due to the fins 148 and is able to dissipate heat efficiently. In the first embodiment, the plural fins 148 include the same thickness, same width, and same height.

Figure 4:
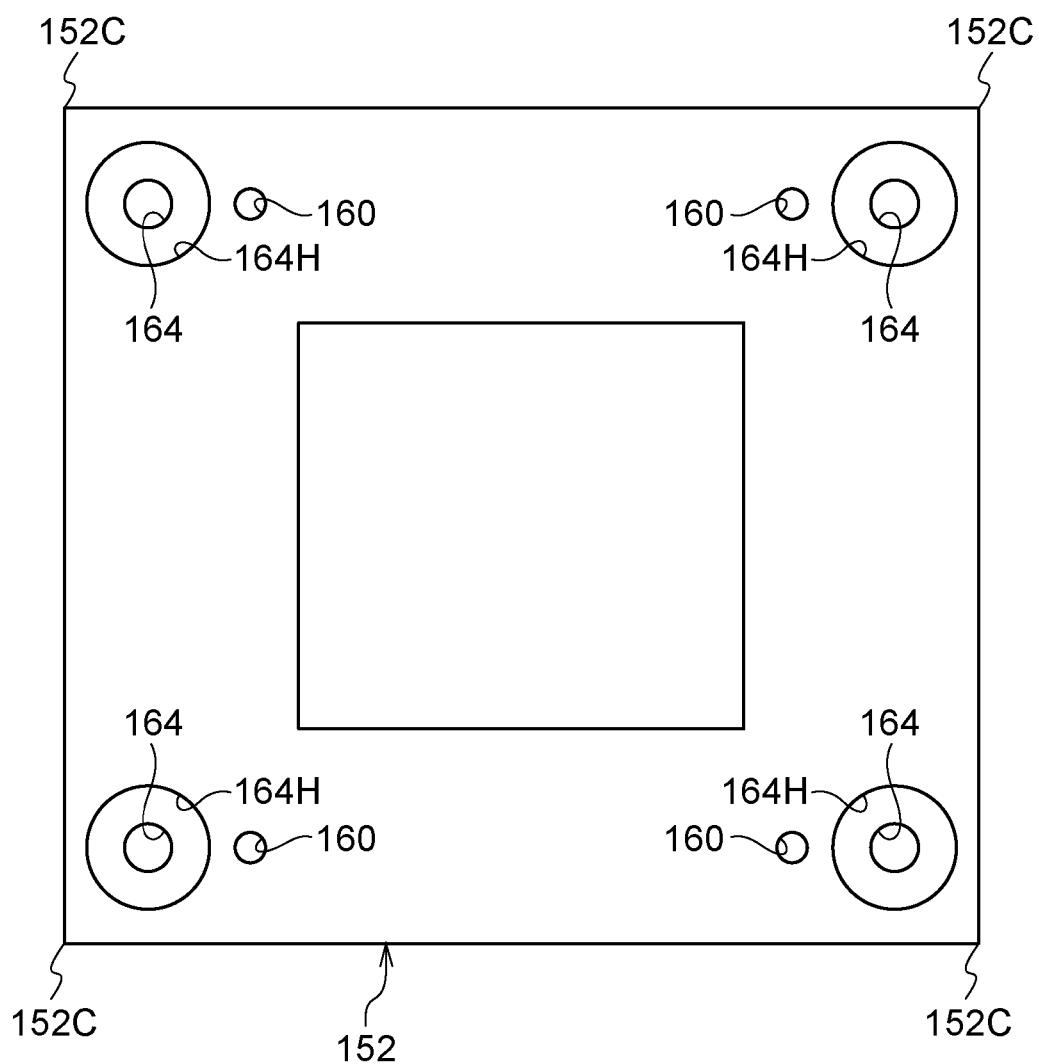
FIG. 4 is a bottom view illustrating a reinforcement member of the substrate of the first embodiment.

On the mounting surface 124A of the base material 124, a reinforcement member (retainer) 152 is provided. In the first embodiment, as illustrated in FIG. 4, the reinforcement member 152 is a rectangular frame-shaped member surrounding (retaining) the heat generating component 140 when viewed in the normal direction to the base material 124 (in the direction of arrow A1 of FIG. 3). The reinforcement member 152 has a higher flexural rigidity than that of the base material 124. Attaching the reinforcement member 152 of high flexural rigidity to the base material 124 reinforces the base material 124 and reduces deformation (bending) of the base material 124.

At four places in the base material 124, corresponding to four corners 152C (see FIG. 4) of the reinforcement member 152, first screw holes 154 are formed. The first screw holes 154 penetrate the thickness of the base material 124.

In the first screw holes 154, the first screws 156 are inserted from a rear surface 124B (the surface opposite to the mounting surface 124A) of the base material 124. External threads 158 of the first screws 156 are screwed into internal threads 160 of the reinforcement member 152 from the side of the base material 124, so that the reinforcement member 152 is attached to the base material 124. The heads (first screw heads 156H) of the first screws 156 protrude from the rear surface 124B of the base material 124.

The external threads 158 (shafts) of the first screws 156 do not penetrate the reinforcement member 152, and tips of the first screws 156 are not exposed from the reinforcement member 152.

At four places in the reinforcement member 152 corresponding to the four corners 152C, second screw holes 164 are formed. The second screw holes 164 penetrate the thickness of the reinforcement member 152.

The heat dissipation member 144 is fixed to the reinforcement member 152 with fixing members (fasteners) 136 while remaining in contact with the heat generating component 140. Each of the fixing members 136 includes a second screw 166 and a coil spring 172 in the first embodiment.

Each of the second screw holes 164 includes an accommodation recess 164H (a counterbore in the first embodiment), which has increased diameter, on the side facing the base material 124. The second screws 166 are inserted through the respective second screw holes 164 from the side of the accommodation recesses 164H. The external threads 168 of the second screws 166 are screwed into the respective internal threads 170 of the base 146 of the heat dissipation member 144 from the side of the reinforcement member 152. The heat dissipation member 144 is thereby attached to the reinforcement member 152.

The head (a second screw head 166H) of each second screw 166 is accommodated in the corresponding accommodation recess 164H. The coil spring 172 (an example of spring) is wound around the second screw 166 and is accommodated between the second screw head 166H and a bottom surface 164B (see FIG. 5) of the accommodation recess 164H. The coil springs 172 apply spring force (indicated by arrows T1) to the respective second screws 166. The heat dissipation member 144 is also subjected to force in the direction toward the reinforcement member 152 (downward in FIG. 3).

The external threads 168 (shafts) of the second screws 166 do not penetrate the base 146 of the heat dissipation member 144, and the tips of the second screws 166 are not exposed from the heat dissipation member 144.

Figure 7:
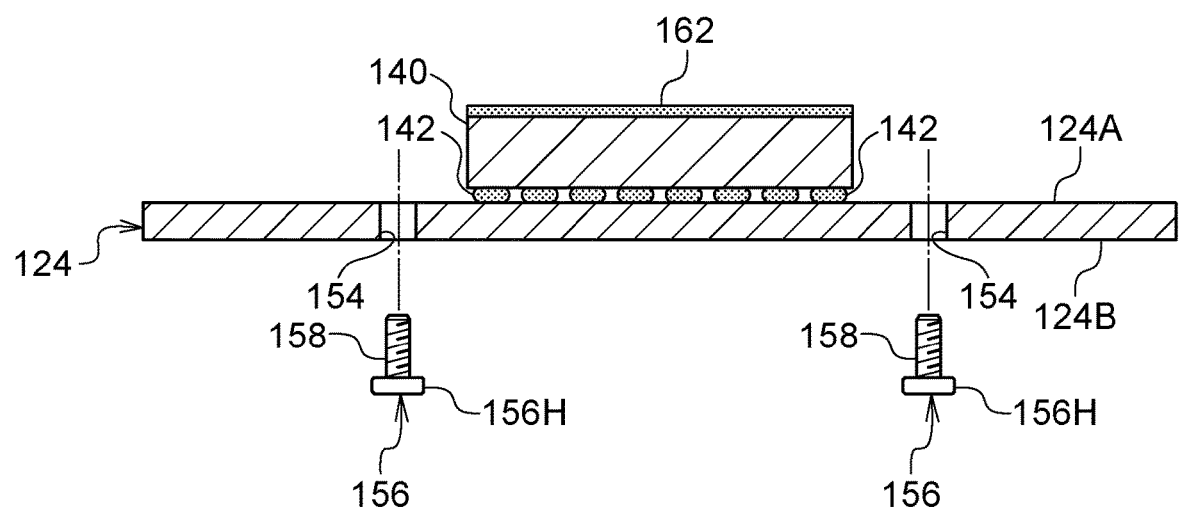
FIG. 7 is a cross-sectional view illustrating a base material on which a heat generating component is mounted in the first embodiment.

Next, a description is given of the method of attaching the reinforcement member 152 and heat dissipation member 144 to the base material 124 in the first embodiment. As illustrated in FIG. 7, the heat generating component 140 is mounted on the base material 124.

Figure 5:
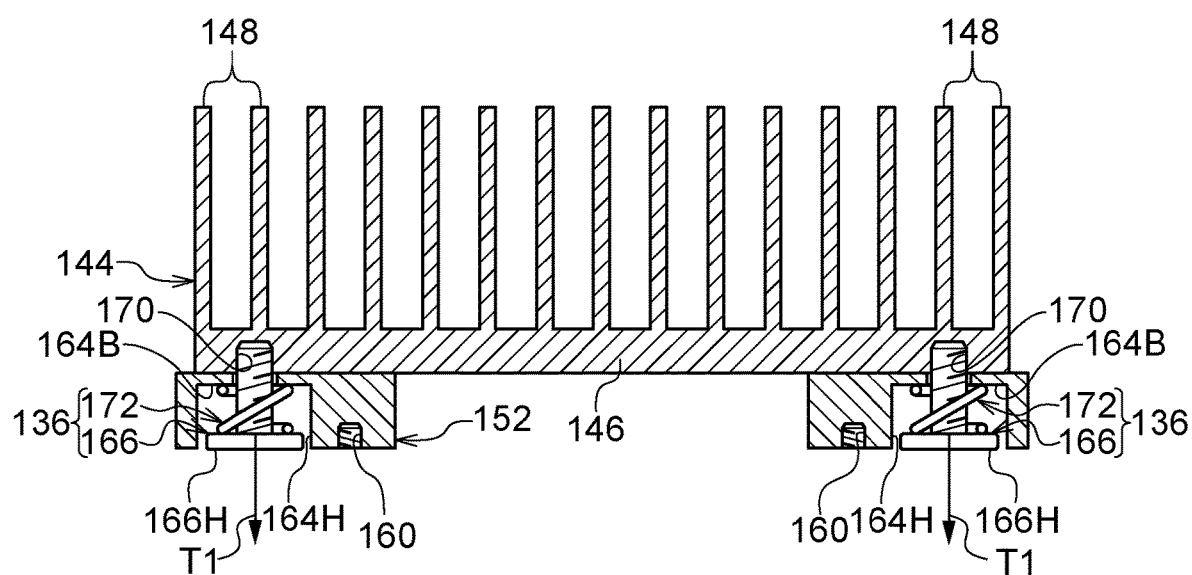
FIG. 5 is a cross-sectional view illustrating the state where a heat sink is attached to the reinforcement member in the first embodiment.
Figure 6:
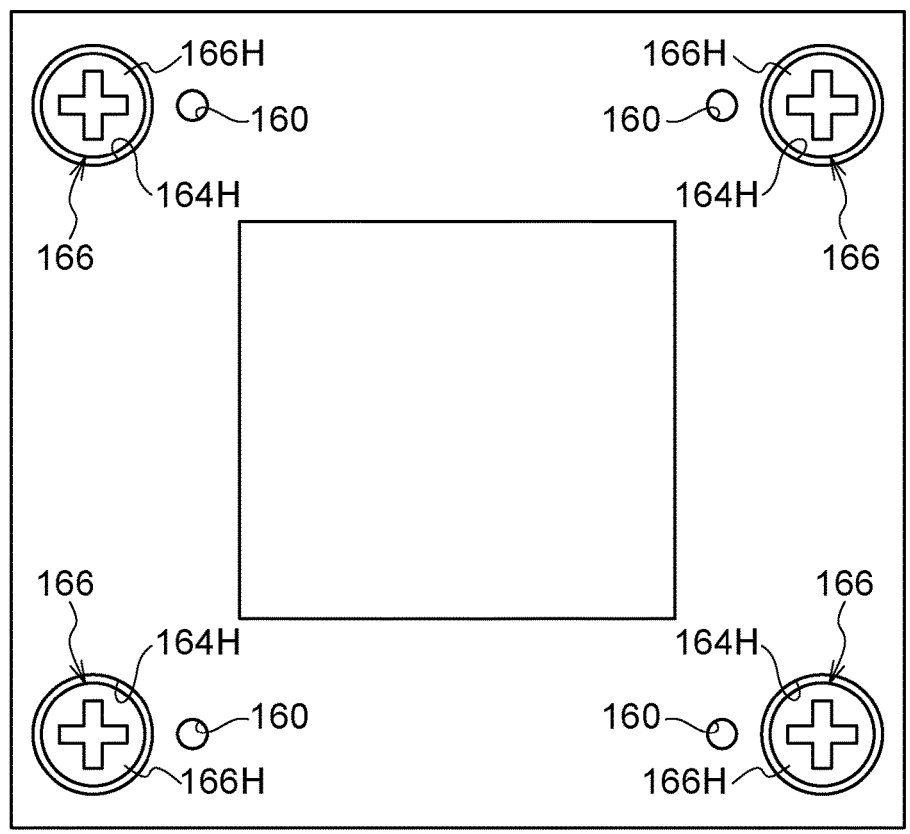
FIG. 6 is a bottom view illustrating the state where the heat sink is attached to the reinforcement member in the first embodiment.

As illustrated in FIGS. 5 and 6, the reinforcement member 152 is attached to the heat dissipation member 144 using the second screws 166. In this state, the coil springs 172 are placed between the second screw heads 166H and the bottom surfaces 164B of the respective accommodation recesses 164H. Spring forces of the coil springs 172 act on the heat dissipation member 144 downward in FIG. 5, that is, in the direction toward the reinforcement member 152, through the second screws 166. The heat dissipation member 144 is thereby attached to the reinforcement member 152 with the base 146 of the heat dissipation member 144 pressed against the reinforcement member 152. In this state, the second screw heads 166H of the second screws 166 and the coil springs 172 are accommodated in the respective accommodation recesses 164H.

Figure 8:
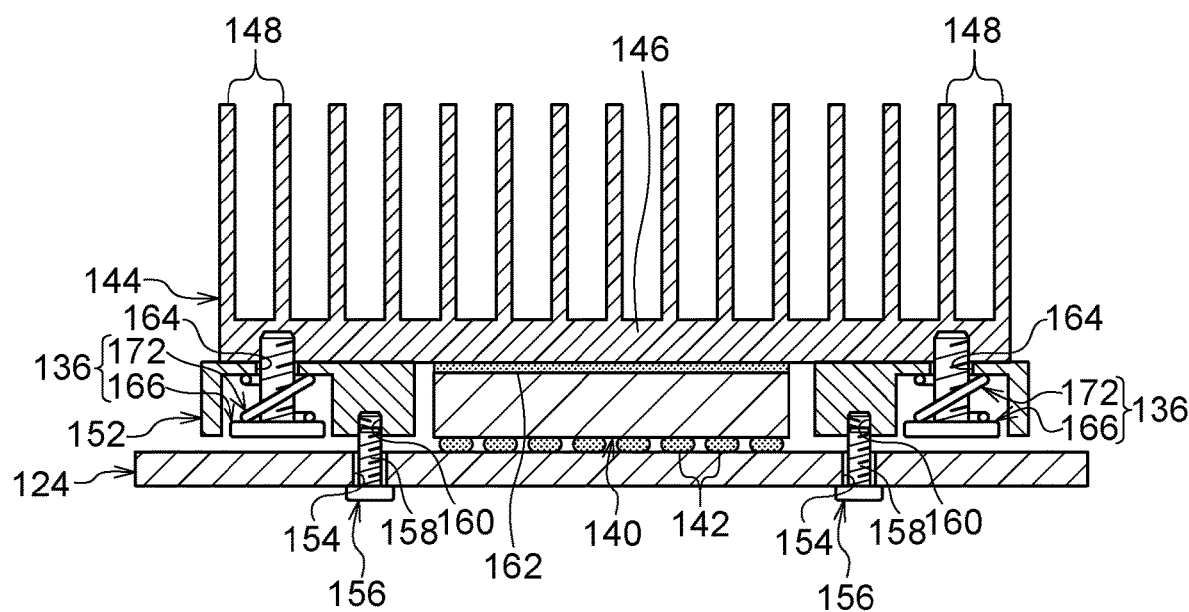
FIG. 8 is a cross-sectional view illustrating a state where the reinforcement member is being attached to the base material in the first embodiment.

Next, as illustrated in FIG. 8, the reinforcement member 152 is placed facing the base material 124 so that the heat generating component 140 is located within the frame form of the reinforcement member 152. The first screws 156 are then inserted through the first screw holes 154 from the rear surface 124B, and the external threads 158 are screwed into the respective internal threads 170 of the reinforcement member 152. The base 146 of the heat dissipation member 144 thereby comes into contact with the heat generating component 140. In this state, the external threads 158 of the first screws 156 are further screwed into the internal threads 160. The reinforcement member 152 thereby separates from the heat dissipation member 144 against the spring forces of the coil springs 172 and moves toward the base material 124 (downward in FIG. 8).

When the reinforcement member 152 is separated from the base 146 of the heat dissipation member 144 in such a manner, gap GP (see FIG. 3) is generated between the reinforcement member 152 and the base 146 of the heat dissipation member 144. The spring forces of the compressed coil springs 172 act on the heat dissipation member 144 through the second screws 166, so that the base 146 of the heat dissipation member 144 is strongly pressed against the heat generating component 140 to be firmly attached to the same.

As illustrated in FIG. 3, the reinforcement member 152 is firmly attached to the mounting surface 124A of the base material 124, thus reinforcing the base material 124.

Next, the operation of the first embodiment is described.

As described above, the reinforcement member 152 is attached to the base material 124 to reinforce the base material 124. The base material 124 is thereby less subject to deformation, such as deflection. This allows the base material 124 and heat generating component 140 to maintain good contact through the solder balls 142.

As illustrated in FIG. 3, the heat generating component 140 is in contact with the base 146 of the heat dissipation member 144 through the thermal bonding member 162. This allows heat from the heat generating component 140 to be transferred to the heat dissipation member 144 for cooling of the heat generating component 140.

In the substrate 122 of the first embodiment, the base material 124 is directly attached to the reinforcement member 152. On the other hand, the heat dissipation member 144 is attached to the reinforcement member 152. In other words, the heat dissipation member 144 is attached to the base material 124 with the reinforcement member 152 interposed therebetween. This reduces the request for the base material 124 to include insertion holes for screws to directly attach the base material 124 to the heat dissipation member 144.

Figure 9:
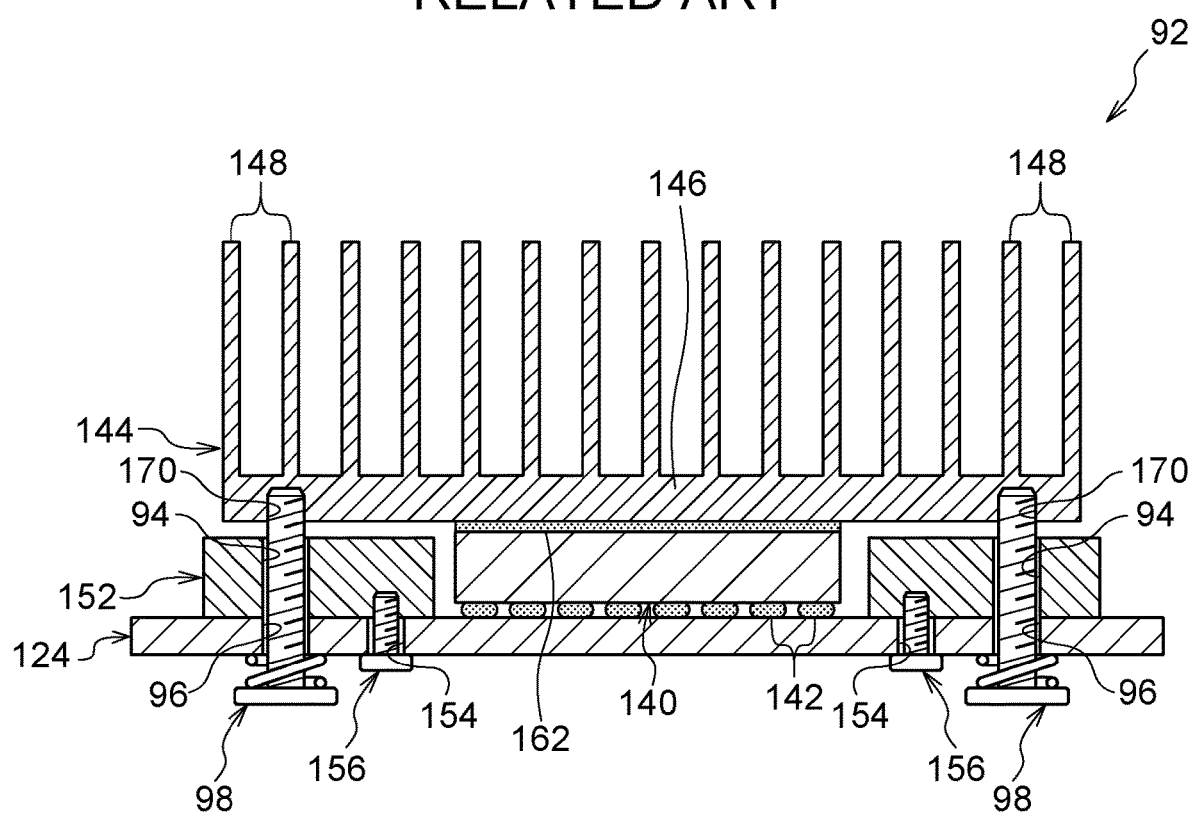
FIG. 9 is a cross-sectional view illustrating a substrate of Comparative Example.
Figure 10:
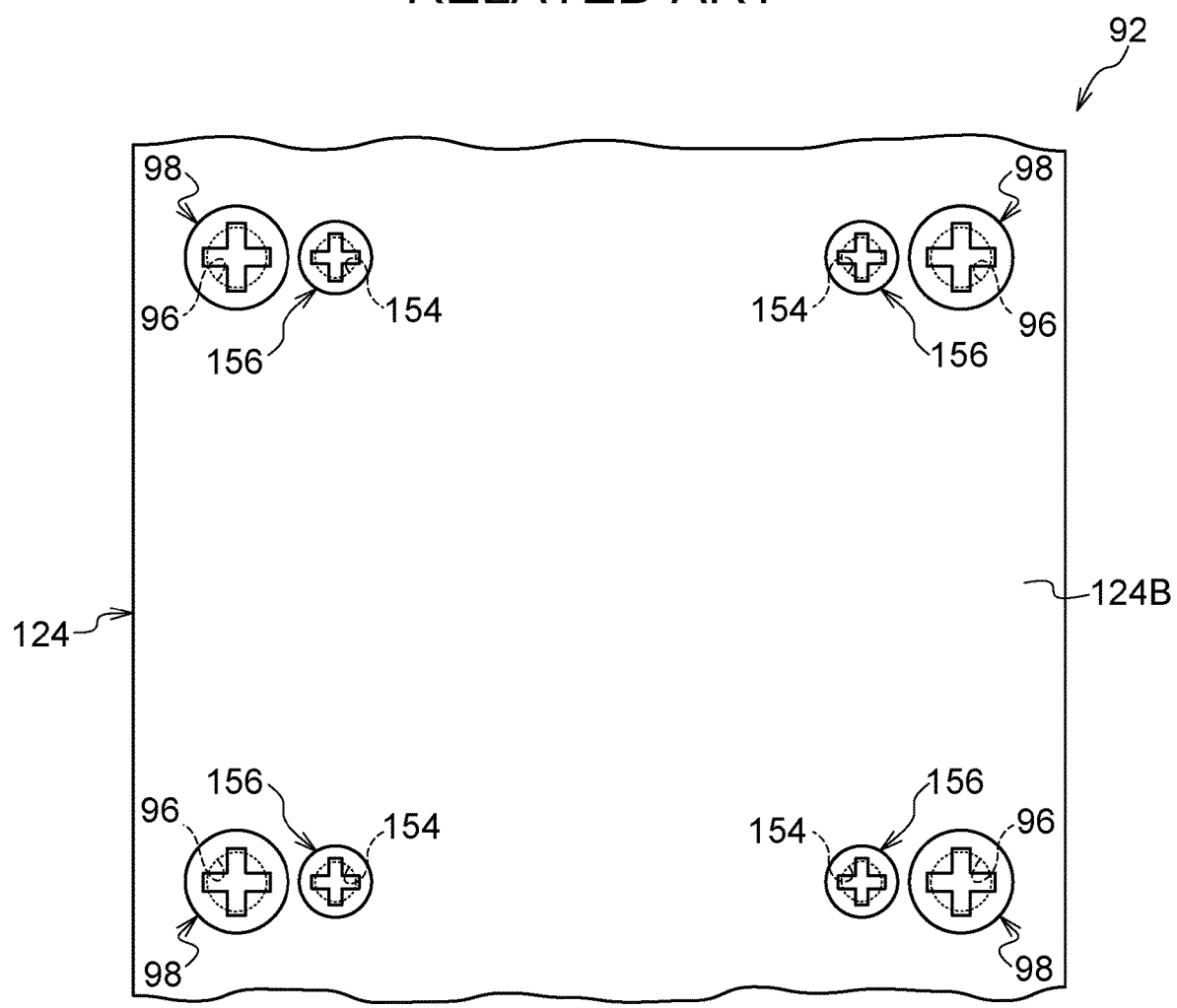
FIG. 10 is a bottom view illustrating the substrate of Comparative Example.

Herein, FIGS. 9 and 10 illustrate a substrate 92 of Comparative Example. In the substrate 92 of Comparative Example, the reinforcement member 152 is provided with through-holes 94 at the same positions as those of the second screw holes 164 of the first embodiment. The base material 124 is provided with through-holes 96 at the positions corresponding to the through-holes 94 of the reinforcement member 152. Attachment screws 98 are inserted through the through-holes 94 and 96 from the side of the rear surface 124B of the base material 124 and are screwed into the internal threads 170 of the heat dissipation member 144. The heat dissipation member 144 is thereby directly attached to the base material 124.

In the substrate 92 of Comparative Example, the through-holes 96 are formed in the base material 124 in addition to the first screw holes 154.

Compared with the thus-configured substrate 92 of Comparative Example, the substrate 122 of the first embodiment is unnecessarily provided with the through-holes 94, that is, insertion holes for screws to directly attach the heat dissipation member 144 to the base material 124. The number of holes formed in the base material 124 of the substrate 122 of the first embodiment is smaller than that of the substrate 92 of Comparative Example.

Since the number of insertion holes in the base material 124 of the substrate 122 of the first embodiment is smaller than that of the substrate 92 of Comparative Example as described above, it is possible to form more wiring patterns with higher density on the base material 124 or mount more electronic components thereon, in addition to the heat generating component 140.

In the substrate 122 of the first embodiment, the accommodation recesses 164H are formed in the respective second screw holes 164 of the reinforcement member 152. Each of the accommodation recesses 164H accommodates the corresponding second screw head 166H and coil spring 172. The second screw heads 166H and coil springs 172 thereby do not protrude from the reinforcement member 152.

In addition, the accommodation recesses 164H are provided for the surface of the reinforcement member 152 facing the base material 124. The second screw heads 166H and coil springs 172 do not protrude from the surface of the reinforcement member 152 on the side facing the base material 124. This allows for implementation of the structure in which the reinforcement member 152 is in surface contact with the base material 124 for firm attachment.

In the first embodiment, the coil springs 172 are located between the second screw heads 166H and the bottom surfaces 164B of the accommodation recesses 164H. The provision of the accommodation recesses 164H for the second screw holes 164 allows the coil springs 172 to have enough length (ensures enough space to accommodate compression and stretching of the coil springs 172) compared with the structure not including the accommodation recesses 164H. In some structures where space for compression stretching of each coil spring 172 is short, the coil springs 172 are designed to have a large spring constant in order to ensure a certain level of pressurization load on the heat dissipation member 144. However, load acting on the heat dissipation member 144 by such coil springs 172 of a large spring constant greatly vary. In the first embodiment, the accommodation recesses 164H ensure enough space to accommodate compression and stretching of the respective coil springs 172 (stretch and compression stroke), so that the coil springs 172 are designed to have a small spring constant. Using the coil springs 172 of a small spring constant reduces variations in the pressurization load acting on the heat dissipation member 144 by the coil springs 172.

The accommodation recesses 164H are provided for the respective second screw holes 164, through which the respective second screws 166 are inserted. In other words, the accommodation recesses 164H are provided corresponding to the respective second screws 166. All the second screw heads 166H and all the coil springs 172 wound around the second screws 166 are therefore accommodated in the respective accommodation recesses 164H.

The coil springs 172 are an example of the spring members. The spring members may be plate springs 226 or the like as described later. When the spring members are the coil springs 172, the spring members are wound around the respective second screws 166, so that the spring members are provided in small space.

Second Embodiment

Next, a description is given of a second embodiment. In the second embodiment, the same elements, members, and the like as those of the first embodiment are given the same reference numerals, and the detailed description thereof is omitted. In the second embodiment, the overall structure of a substrate 222 is the same as that of the substrate 122 of the first embodiment. The substrate 222 is not illustrated in the drawings.

Figure 11:
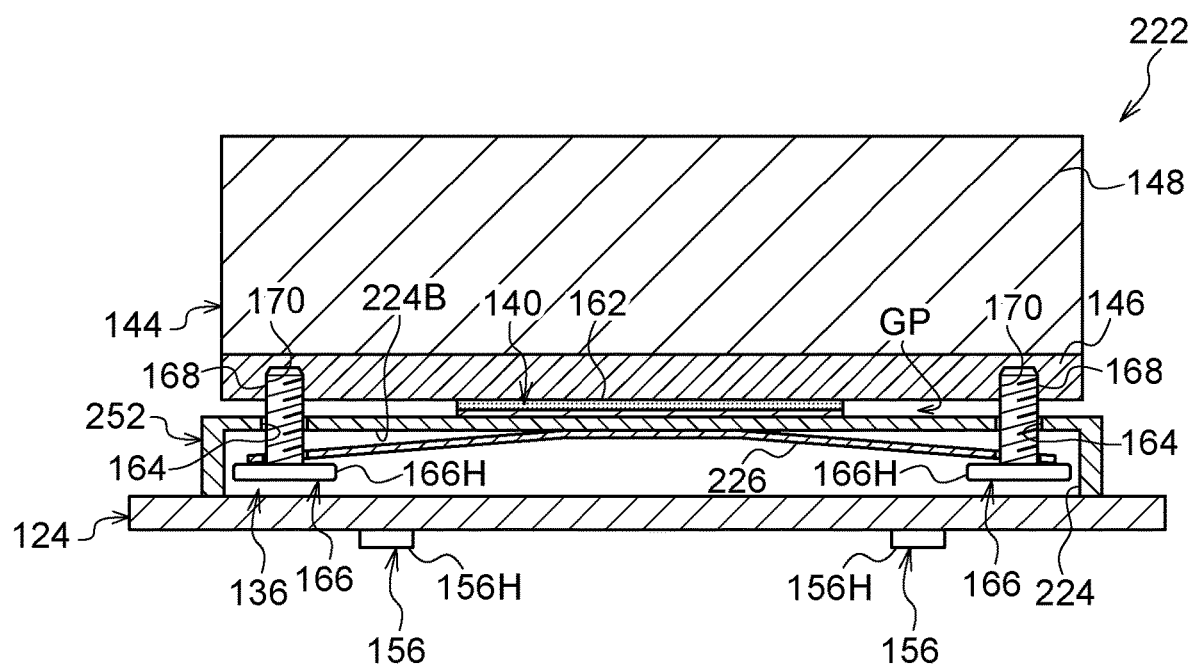
FIG. 11 is a cross-sectional view illustrating a substrate of a second embodiment.

As illustrated in FIG. 11, the substrate 222 of the second embodiment includes a reinforcement member (retainer) 252. On the side of the reinforcement member 252 facing the base material 124, rectangular accommodation recesses 224 are formed. As illustrated in FIGS. 12 and 13, the accommodation recesses 224 are formed along sides 252H of the reinforcement member 252 so as to be shared by the respective pairs of the second screw holes 164.

Each of the accommodation recesses 224 accommodates two of the second screw heads 166H of the second screws 166. In each accommodation recess 224, a plate spring 226 is provided between the two second screw heads 166H and a bottom surface 224B of the accommodation recess 224. In the second embodiment, the plate springs 226 are an example of the spring members.

In the second embodiment, therefore, the number of the accommodation recesses 224 is smaller than that of the second screw holes 164, and the structure of the reinforcement member 252 is simpler.

In the second embodiment, each plate spring 226 as an example of the spring members is shared by some of the second screws 166. The number of spring members is smaller than that in a structure where the spring members are provided for the respective second screws 166. In the second embodiment, since the plate springs 226 are used as the spring members, it is possible to easily implement a structure in which each spring member is shared by some of the second screws 166.

In the second embodiment, the method of attaching the reinforcement member 252 and heat dissipation member 144 to the base material 124 may follow the same procedure as that of the first embodiment. Specifically, the reinforcement member 252 is attached to the heat dissipation member 144 with the second screws 166. The reinforcement member 252 is then placed facing the base material 124 with the heat generating component 140 placed within the frame form of the reinforcement member 252. The reinforcement member 252 is fixed to the base material 124 with the first screws 156.

In the first and second embodiments, the second screws 166 are screwed into the internal threads 170 without penetrating the heat dissipation member 144. Since the second screws 166 do not penetrate the heat dissipation member 144, the heat dissipation member 144 ensures a large heat capacity and maintains strength compared with the structure in which the second screws 166 penetrate the heat dissipation member 144.

In the first and second embodiments, the plural second screw holes 164 are formed corresponding to the plural second screws 166 in the reinforcement member 252. Since the second screw holes 164 are provided, the second screws 166 are inserted from the side facing the reinforcement member 252 to be screwed into the internal threads 170 of the heat dissipation member 144. This ensures fixation of the heat dissipation member 144 to the reinforcement member 152 with a simple structure.

Third Embodiment

Next, a description is given of a third embodiment. In the third embodiment, the same elements, members, and the like as those of the first embodiment are given the same reference numerals, and the detailed description thereof is omitted. In the third embodiment, the overall structure of a substrate 322 is the same as that of the substrate 122 of the first embodiment. The substrate 322 is not illustrated in the drawings.

Figure 15:
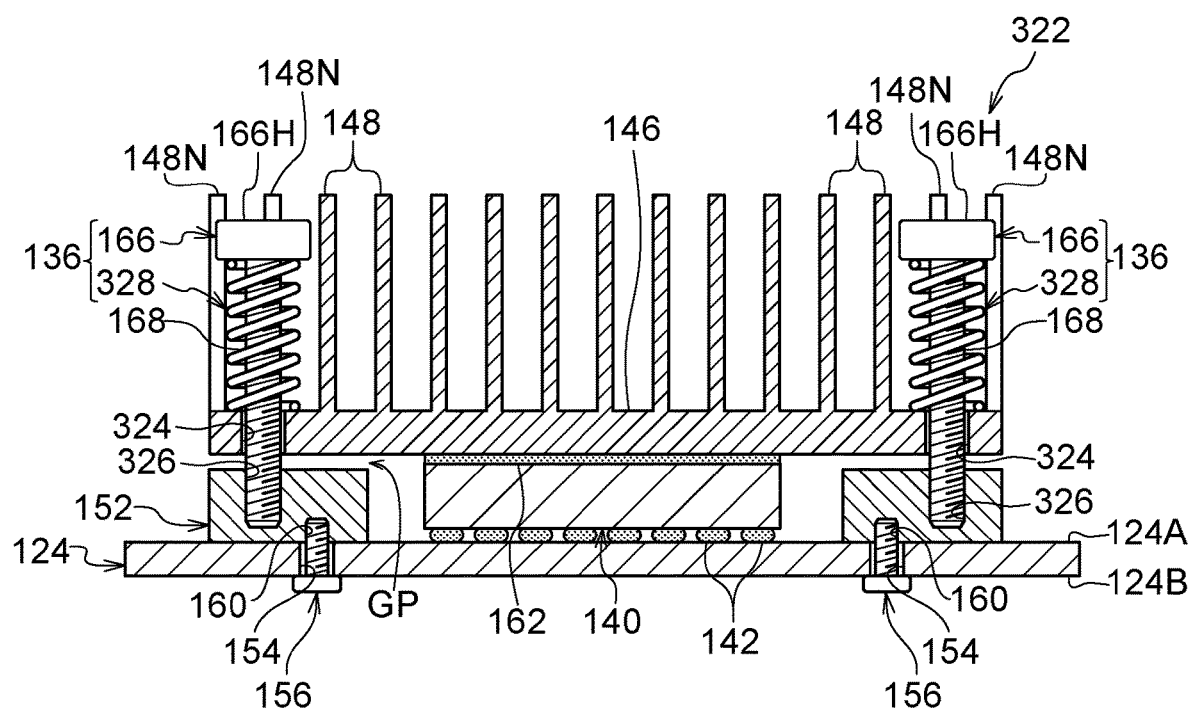
FIG. 15 is a cross-sectional view of the substrate of the third embodiment cut along a line XV-XV of FIG. 14.

As illustrated in FIG. 15, in the substrate 322 of the third embodiment, the base 146 of the heat dissipation member 144 includes insertion holes 324. The second screws 166 are inserted through the insertion holes 324 from the opposite side to the reinforcement member 152 (the upper side in FIG. 15) to be screwed into internal threads 326 in the reinforcement member 152. The heat dissipation member 144 is thereby attached to the reinforcement member 152. Coil springs 328 are provided between the second screw heads 166H and the base 146 of the heat dissipation member 144 and are wound around the respective second screws 166. The coil springs 328 apply force to the base 146 of the heat dissipation member 144 in the direction toward the heat generating component 140 (downward in FIG. 15).

Figure 14:
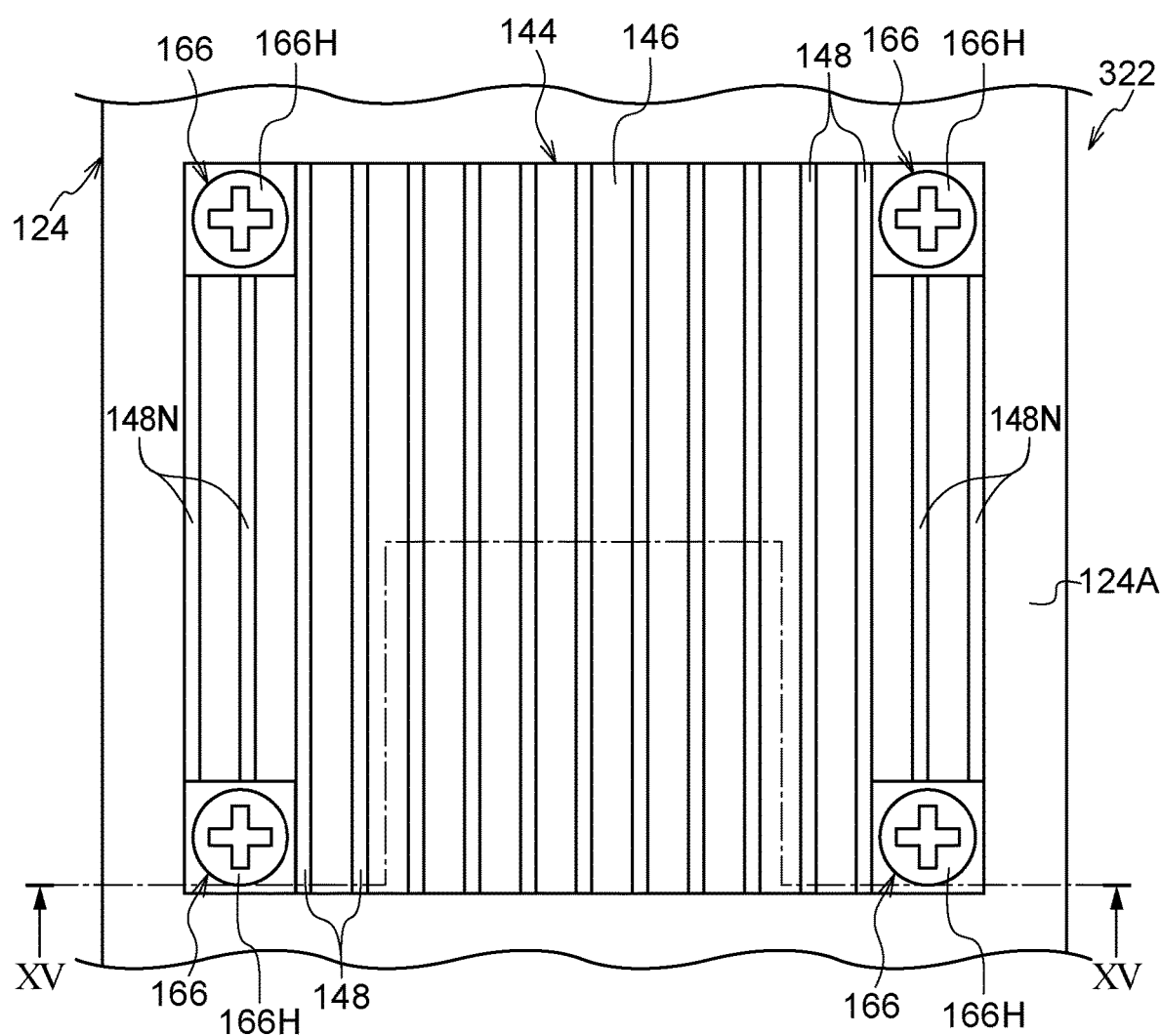
FIG. 14 is a plan view illustrating part of a substrate of a third embodiment.

As illustrated in FIG. 14, the heat dissipation member 144 includes fins 148N in portions corresponding to the second screws 166, instead of the fins 148. The fins 148N are narrower than the fins 148 so as not to interfere with the second screws 166.

In the substrate 322 of the third embodiment, the second screw heads 166H are located on the opposite side of the base 146 of the heat dissipation member 144 from the reinforcement member 152, that is, on the opposite side from the base material 124. This ensures a large distance between the second screw heads 166H and the base 146 of the heat dissipation member 144 and thereby ensures a space wide enough to accommodate stretching and compression of the coil springs 328.

In the substrate 122 of the first embodiment, the second screws 166 do not protrude from the base 146 of the heat dissipation member 144 to the side of the fins 148. In other words, the second screws 166 do not affect the shape and arrangement of the fins 148.

In the third embodiment, the method of attaching the reinforcement member 152 and heat dissipation member 144 to the base material 124 may follow the same procedure as that of the first embodiment.

In the third embodiment, alternatively, the reinforcement member 152 may be fixed to the base material 124 using the first screws 156 before the heat dissipation member 144 is attached to the reinforcement member 152 using the second screws 166.

Fourth Embodiment

Next, a description is given of a fourth embodiment. In the fourth embodiment, the same elements, members, and the like as those of the first embodiment are given the same reference numerals, and the detailed description thereof is omitted. In the fourth embodiment, the overall structure of a substrate 422 is the same as that of the substrate 122 of the first embodiment. The substrate 422 is not illustrated in the drawings.

In the substrate 422 of the fourth embodiment, the reinforcement member 152 and heat dissipation member 144 are fixed by clips 424. In the example illustrated in FIG. 16, the clips 424 are provided at respective four corners of the base 146 of the heat dissipation member 144 when viewed in the normal direction to the base material 124 (in the direction of arrow A1 in FIG. 17).

Figure 16:
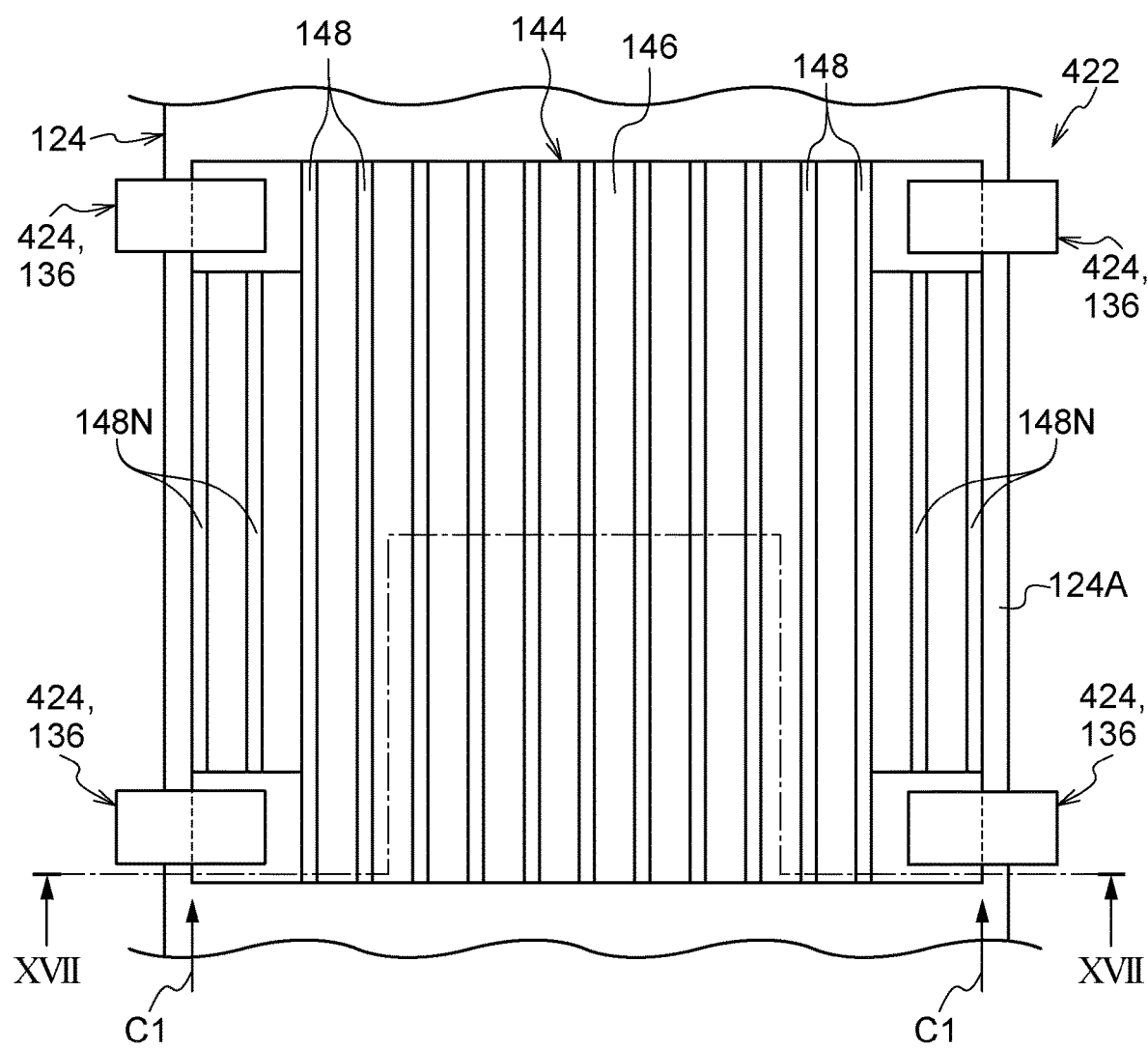
FIG. 16 is a plan view illustrating part of a substrate of a fourth embodiment.
Figure 17:
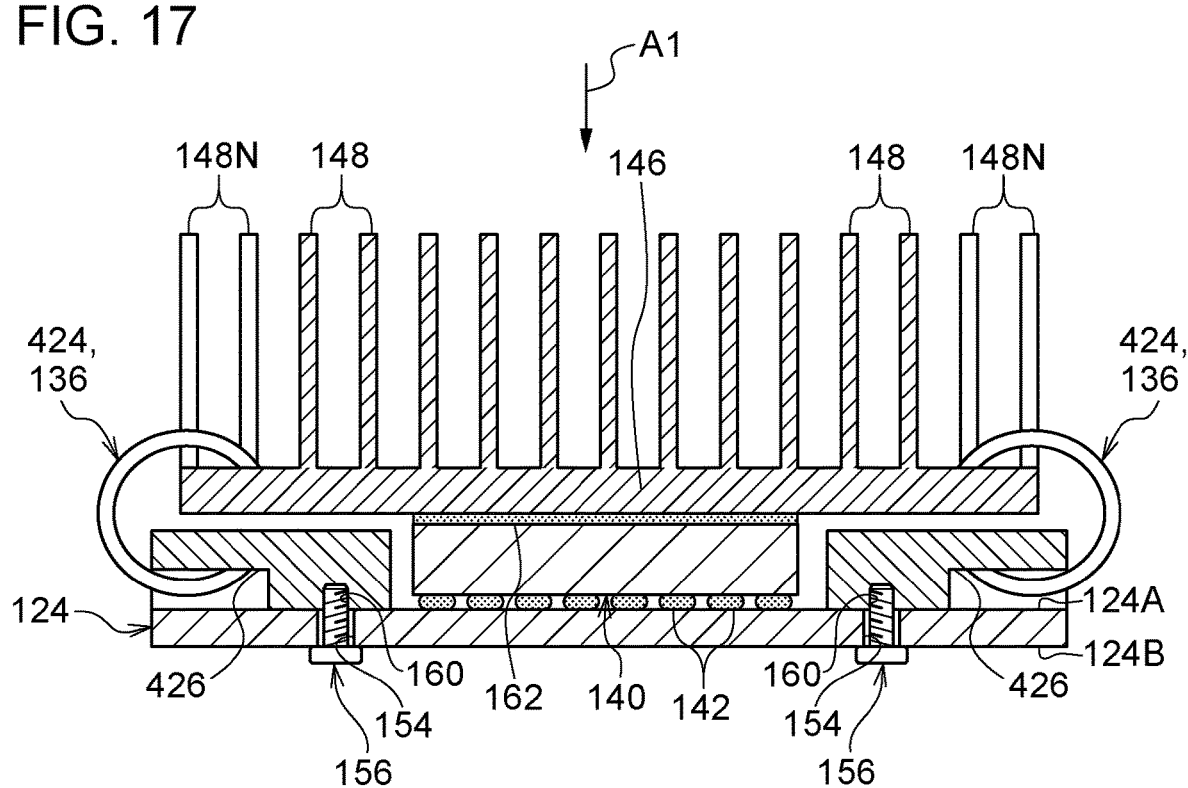
FIG. 17 is a cross-sectional view of the substrate of the fourth embodiment cut along a line XVII-XVII of FIG. 16.

Each of the clips 424 is cylindrical and has a portion partially removed when viewed in the axial direction (in the direction of arrow C1 in FIG. 16). The clips 424 sandwich the reinforcement member 152 and the base 146 of the heat dissipation member 144 in the removed portion and apply spring force in such a direction that the reinforcement member 152 and heat dissipation member 144 come close to each other. In the fourth embodiment, the clips 424 are an example of the spring members. The shape of the clips 424 is not limited to the aforementioned cylindrical shape as long as the clips 424 are able to sandwich the reinforcement member 152 and heat dissipation member 144 with spring force.

In the surface of the reinforcement member 152 facing the base material 124, clip accommodation sections 426 are formed. The clip accommodation sections 426 partially accommodate the respective clips 424. Each clip 424 is partially accommodated in the corresponding clip accommodation section 426 so as not to protrude to the side of the base material 124.

In the fourth embodiment, the method of attaching the reinforcement member 152 and heat dissipation member 144 to the base material 124 may follow the same procedure as that of the first embodiment. Alternatively, as described in the third embodiment, the reinforcement member 152 may be fixed to the base material 124 using the first screws 156 before the heat dissipation member 144 is attached to the reinforcement member 152 using the second screws 166.

In the substrate 422 of the fourth embodiment, the reinforcement member 152 and heat dissipation member 144 are sandwiched with the spring force of the clips 424 as described above. This reduces the request for formation of holes to insert the second screws 166, in the reinforcement member 152 or the base 146 of the heat dissipation member 144. The reinforcement member 152 and the base 146 of the heat dissipation member 144 thereby maintain high strength. Furthermore, the base 146 of the heat dissipation member 144 ensures a large heat capacity.

In the structure where the reinforcement member (retainer) is provided with the second screw holes 164 like the first and second embodiments, the second screws 166 are inserted through the second screw holes 164. The second screws 166 are then screwed into the internal threads 170 of the base 146 of the heat dissipation member 144. This reduces misalignment between the reinforcement member 152 and heat dissipation member 144 in the horizontal direction.

Also in the third embodiment, the second screws 166 inserted through the second screw holes 164 of the base 146 of the heat dissipation member 144 are screwed into the internal threads 326 of the reinforcement member 152. This reduces misalignment between the reinforcement member 152 and heat dissipation member 144.

In the first to third embodiments, the spring members (the coil springs 172, plate springs 226, and coil springs 328) are provided between the second screw heads 166H of the second screws 166 and the reinforcement member 152. The spring members are held by the second screw heads 166H. This reduces the request for a new member to hold the spring members, and the number of components is not increased.

In the first to third embodiments, the fixing member (fastener) to fix the reinforcement member 152 and heat dissipation member 144 includes the second screws 166 and thereby reliably fixes the reinforcement member 152 and heat dissipation member 144. The plural second screws 166 reduce rotation of the reinforcement member 152 relative to the heat dissipation member 144.

In each of the aforementioned embodiments, the spring force of the spring members is configured to act on the heat dissipation member 144 so that the base 146 of the heat dissipation member 144 is pressed against the heat generating component 140. This maintains stable contact between the base 146 of the heat dissipation member 144 and the heat generating component 140.

In each of the aforementioned embodiments, the base material 124 includes the plural first screw holes 154, through which the first screws 156 are inserted. The first screws 156 are screwed into the respective internal threads 160 of the reinforcement member 152, allowing the reinforcement member 152 to be attached to the base material 124. The use of the plural first screws 156 allows for attachment of the reinforcement member 152 to the base material 124 with less relative misalignment.

The reinforcement member 152 is of a rectangular frame shape when viewed in the normal direction to the base material 124 and surrounds the heat generating component 140. The reinforcement member 152 therefore reduces deformation of the base material 124, such as deflection, for reinforcement around the heat generating component 140. This maintains good electrical connection between the heat generating component 140 and the base material 124 through the solder balls 142.

The plural first screw holes 154 are formed at the positions corresponding to the four corners of the reinforcement member 152 in the base material 124, when viewed in the normal direction of the base material 124. The reinforcement member 152 is fixed to the base material 124 with the first screws 156 at the four corners. This effectively reduces inclination and elevation of the reinforcement member 152 from the base material 124.

Figure 18:
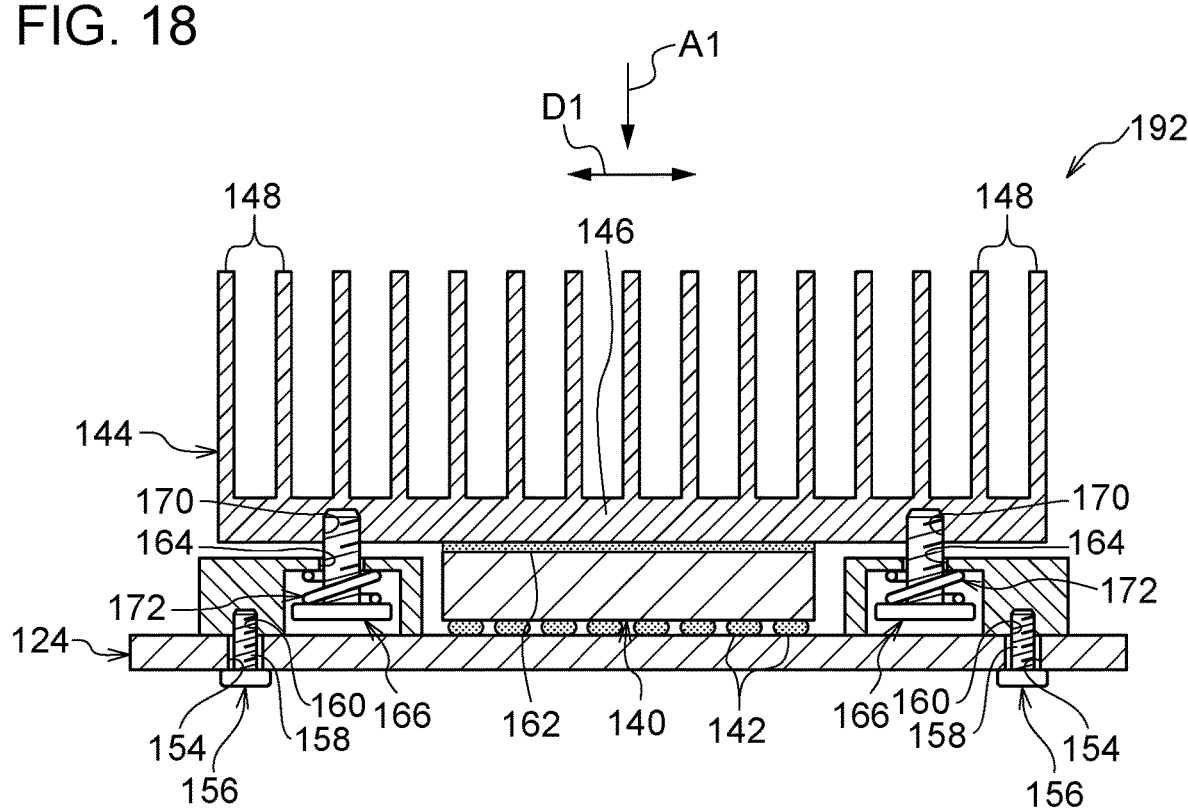
FIG. 18 is a cross-sectional view of a substrate of a modification of the first embodiment cut along the same position as that of FIG. 3.

In the structure illustrated in the cross-sectional view of FIG. 3, the first screws 156 are located closer to the heat generating component 140 than the corresponding second screws 166 are. As illustrated in FIG. 18 as a modification of the first embodiment, a substrate 192 may be configured so that the second screws 166 are located closer to the heat generating component 140 than the corresponding first screws 156 are.

In the structure where the first screws 156 are located closer to the heat generating component 140 than the corresponding second screws 166 are, the first screws 156 are located close to the solder balls 142. This highly effectively maintains good electrical contact between the base material 124 and heat generating component 140 through the solder balls 142. In the heat dissipation member 144, the second screw holes 164 are distant from the heat generating component 140. This ensures large heat capacity in part closer to the heat generating component 140.

In the structure where the second screws 166 are located closer to the heat generating component 140 than the corresponding first screws 156 are, the second screws 166 are located close to the contact between the heat generating component 140 and the base 146 of the heat dissipation member 144. This highly effectively maintains the contact between the heat generating component 140 and the base 146 of the heat dissipation member 144.

The substrates 122, 222, 322, and 422 of the aforementioned embodiments are extension cards which are electrically connected to the motherboard 132 of the electronic device 130 (see FIGS. 1 and 2) and includes a function to extend the functionality of the electronic device 130 by way of example. The extension card is additionally mounted within the electronic device 130 in some cases. In such a case, the space for mounting is sometimes small. In the substrates 122, 222, 322, and 422 of the aforementioned embodiments, the second screw heads 166H do not protrude to the side of the rear surface 124B of the base material 124. This allows the extension card to be mounted even in a small mounting space. When the substrates 122, 222, 322, and 422 employ extension cards (PCI cards are an example thereof) with the shape standards prescribed, for example, the shape of the substrates 122, 222, 322, and 422 is accommodated within the standards. In the substrates 122, 222, 322, and 422 within the standards, the space allowing the spring members to deform is ensured, and the spring members are therefore configured to have a small spring constant. This reduces variations in pressurization load acting on the heat dissipation member 144 by the spring members.

Hereinabove, the embodiments of the technique disclosed in the application are described. The technique disclosed in the application is not limited to the above description and is variously changed without departing from the scope of disclosure in addition to the above-described embodiments.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A substrate comprising:
    a circuit board;
    a heat generator mounted over a mounting surface of the circuit board;
    a heat sink in contact with the heat generator;
    a retainer attached to the mounting surface so as to retain the heat generator and reinforce the circuit board; and
    a fastener configured to fix the heat sink to the retainer so as to bring the heat sink into contact with the heat generator,
    the fastener is configured to include a second screw with which the heat sink is attached to the retainer,
    the fastener is configured to include a spring wound around the second screw, the spring applying spring force to the second screw so as to press the heat sink to the heat generator,
    the retainer is configured to include a plurality of second screw holes, the second screw being inserted through a second screw hole of the plurality of second screw holes,
    a second screw hole of the plurality of second screw holes is provided with an accommodation recess configured to accommodate a screw head of the second screw and the spring,
    the accommodation recess is provided for the retainer to be shared by some of the plurality of the second screw holes, and
    the spring is a plate spring provided between the screw head and the retainer in the accommodation recess.

2. The substrate according to claim 1,
    wherein the circuit board is configured to include a plurality of first screw holes, and
    wherein the retainer is attached to the circuit board with a plurality of first screws inserted through the plurality of first screw holes, respectively.

3. The substrate according to claim 2, wherein the retainer has a rectangular frame shape surrounding the heat generator when viewed in the normal direction of the circuit board.

4. The substrate according to claim 3, wherein the plurality of first screw holes are formed at positions corresponding to four corners of the retainer, in the circuit board.

5. The substrate according to claim 1, wherein the spring is provided between a screw head of the second screw and the retainer or the heat sink.

6. The substrate according to claim 1, wherein the accommodation recess is provided in a surface of the retainer that faces the circuit board.

7. The substrate according to claim 1, wherein the spring is a coil spring wound around the second screw between the screw head and the retainer in the accommodation recess.

8. The substrate according to claim 1, wherein the second screw is screwed into the heat sink without while penetrating the heat sink.

9. The substrate according to claim 1, wherein the spring is configured to sandwich the retainer and the heat sink so as to press the heat sink toward the retainer.

10. The substrate according to claim 1, further comprising:
    a terminal electrically coupled to a slot provided for a motherboard of an electronic device,
    wherein the substrate is an extension card to extend functionality of the electronic device.

* * * * *